(12) United States Patent
Korsunsky et al.

(10) Patent No.: US 7,077,678 B1
(45) Date of Patent: Jul. 18, 2006

(54) ELECTRICAL CONNECTOR ASSEMBLY HAVING BOARD HOLD DOWN

(75) Inventors: Iosif R. Korsunsky, Harrisburg, PA (US); Robert W. Brown, Harrisburg, PA (US); Joanne E. Shipe, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/038,556

(22) Filed: Jan. 18, 2005

(51) Int. Cl.
  *H01R 13/62* (2006.01)
(52) U.S. Cl. ..................................... 439/326; 439/328
(58) Field of Classification Search ......... 439/326–328
  See application file for complete search history.

(56) References Cited

U.S. PATENT DOCUMENTS

| 3,701,071 A | * | 10/1972 | Landman .................. 200/5 R |
| 5,484,302 A | | 1/1996 | Yamada et al. |
| 5,816,838 A | * | 10/1998 | Del Prete et al. ............ 439/326 |
| 6,234,820 B1 | * | 5/2001 | Perino et al. ................ 439/326 |
| 6,955,554 B1 | * | 10/2005 | Korsunsky et al. ......... 439/328 |
| 2004/0152353 A1 | * | 8/2004 | Kawamae ................... 439/328 |
| 2005/0048828 A1 | * | 3/2005 | Ho et al. .................... 439/326 |

* cited by examiner

*Primary Examiner*—Tho D. Ta
(74) *Attorney, Agent, or Firm*—Wei Te Chung

(57) ABSTRACT

An electrical connector assembly (1) includes a mother board (10) defining a pair of retention holes (13), a card edge connector (20) mounted on the mother board, a daughter card (30) including a mating edge (31) inserted into the card edge connector and a rear edge (32) defining a pair of engaging holes (320) vertically aligned with the pair of retention holes of the mother board, and a board hold down (40). The board hold down includes a pair of supporting portions (44) supporting the rear edge of the daughter card, a pair of retaining portions (42), and an operating portion (43) between the pair of retaining portions and having a spring tab (434) locking the rear edge of the daughter card. Each of the retaining portions includes a mounting portion (422) soldered in a corresponding retention hole and a positioning portion (421) engaged with a corresponding engaging hole.

20 Claims, 5 Drawing Sheets

US 7,077,678 B1

ELECTRICAL CONNECTOR ASSEMBLY HAVING BOARD HOLD DOWN

CROSS-REFERENCE TO RELATED APPLICATIONS

Relevant subject matter is disclosed in U.S. patent application Ser. No. 10/766,158 filed on Jan. 27, 2004 and entitled "ELECTRICAL CONNECTOR ASSEMBLY HAVING BOARD HOLD DOWN", which is invented by the same inventor and assigned to the same assignee as this application.

BACKGROUND OF THE INVENTION

1. Field of the Invention

The present invention relates to an electrical connector assembly, and particularly to an assembly having a board hold down for detachably holding a circuit board to another circuit board thereof.

2. Description of Related Art

Card edge connectors, such as PCI (Peripheral Component Interconnect) and PCI Express connectors, are widely used to connect daughter cards and mother boards. Typically, each of the card edge connectors generally comprises an elongate housing defining an elongate slot for receiving a mating edge of the daughter card, a plurality of terminals disposed along one or both sides of the slot for engaging conductive pads disposed on the mating edge of the daughter card, and a pair of latch members attached to opposite ends of the housing. For example, U.S. Pat. No. 5,484,302 (the '302 patent) shows such a card edge connector.

The card edge connector of the '302 patent is arranged to be mounted on a mother board and to hold a daughter card in an orientation which is parallel to the mother board. The card edge connector has discrete metal latches held in guide frames which extend outwardly from opposite ends of a housing. A plurality of terminals are received in the housing and have solder tails which are electrically connected to the mother board by surface mount soldering. The latches have integral solder tabs which are also attached to the mother board by surface mounting soldering to increase the retention of the card edge connector to the mother board and to reduce stresses imposed on the solder connections of the terminals. The solder tails of the terminals and the solder tabs of the latches must be coplanar so that good solder joints can be produced, but it is difficult to ensure a close coplanarity tolerance on these parts. Also, the latches should extend precisely perpendicular to the housing for effective latching of the daughter card and for proper alignment with solder pads on the mother board. There is a need for the card edge connector having improved means for accurate positioning of the latches. Further, the guide frames increase a longitudinal dimension of the housing, so large space of the mother board is occupied by the card edge connector. This problem is especially critical in some applications where several card edge connectors are arranged on the mother board side by side.

Hence, an electrical connector assembly having an improved board hold down to solve the above problems is desired.

SUMMARY OF THE INVENTION

An object of the present invention is to provide an electrical connector assembly having a daughter card which can accurately and reliably engage with a card edge connector thereof.

Another object of the present invention is to provide an electrical connector assembly having a card edge connector which occupies small space of a mother board thereof.

To achieve the above objects, an electrical connector assembly in accordance with the present invention comprises a mother board defining a pair of retention holes, a card edge connector mounted on the mother board, a daughter card including a mating edge inserted into the card edge connector and a rear edge defining a pair of engaging holes, and a board hold down. The board hold down includes a pair of retaining portions and an operating portion between the pair of retaining portions. Each of the retaining portions includes a mounting portion soldered in a corresponding retention hole of the mother board and a positioning portion engaged with a corresponding engaging hole of the daughter card. The operating portion includes a latch portion having a spring tab abutting against an upper face of the rear edge of the daughter card.

Other objects, advantages and novel features of the invention will become more apparent from the following detailed description when taken in conjunction with the accompanying drawings.

DETAILED DESCRIPTION OF THE PREFERRED EMBODIMENT

Figure 1:
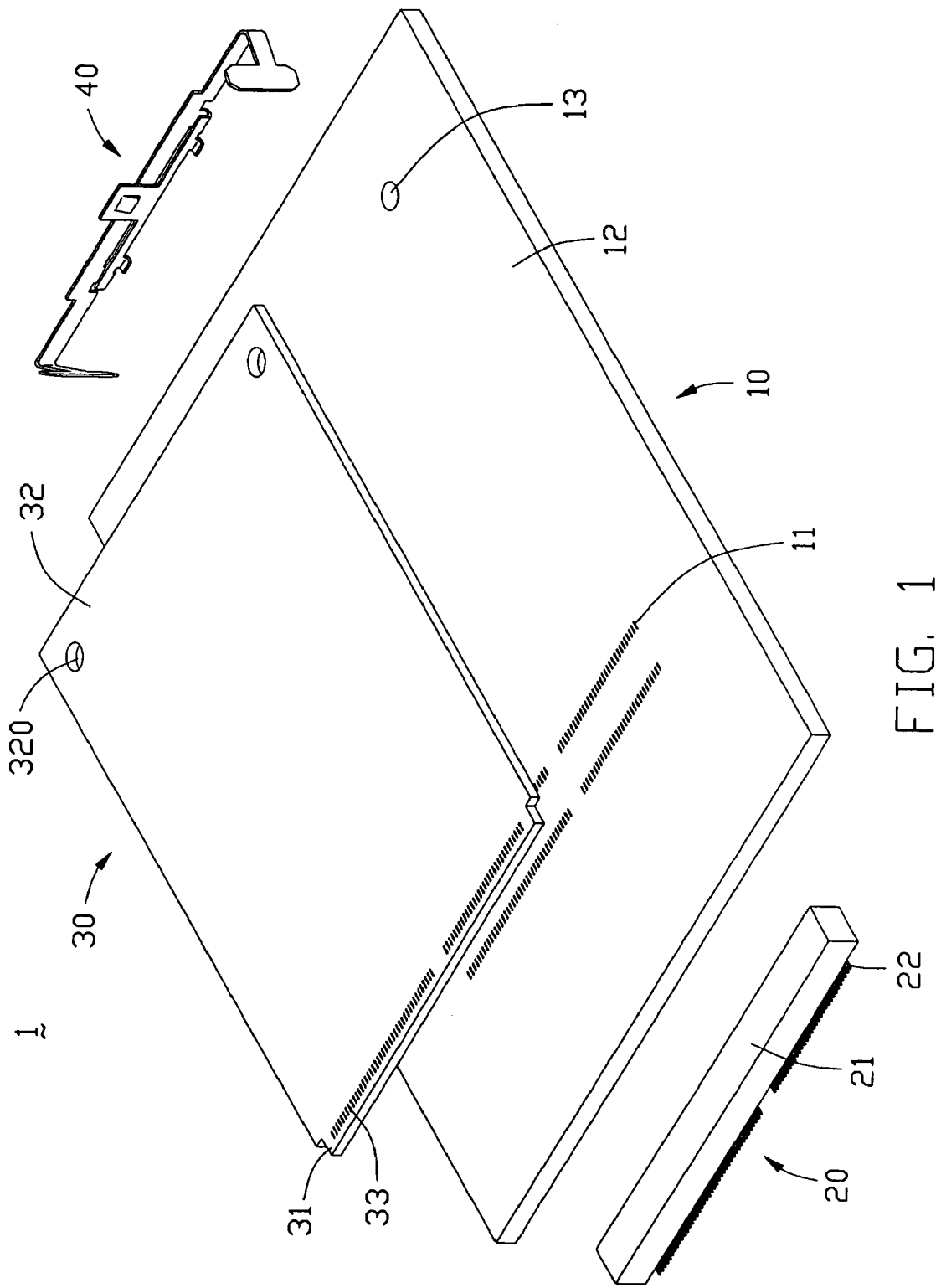
FIG. 1 is an exploded perspective view of an electrical connector assembly in accordance with the present invention.

Referring to FIG. 1, an electrical connector assembly 1 in accordance with the present invention comprises a mother board 10, a card edge connector 20, a daughter card 30, and a board hold down 40.

The mother board 10 comprises two rows of solder pads 11 arranged on an upper surface 12 thereof and adjacent to a front end thereof. A pair of retention holes 13 are defined adjacent to a rear end of the mother board 10. The card edge connector 20 comprises an elongate housing 21 and a plurality of contacts 22 received in the housing 21. The daughter card 30 comprises a mating edge 31 at a front end thereof and a rear edge 32 opposite to the mating edge 31. The rear edge 32 defines a pair of engaging holes 320 adjacent to opposite side edges thereof. A plurality of conductive pads 33 are provided on opposite sides of the mating edge 31 of the daughter card 30.

Figure 2:
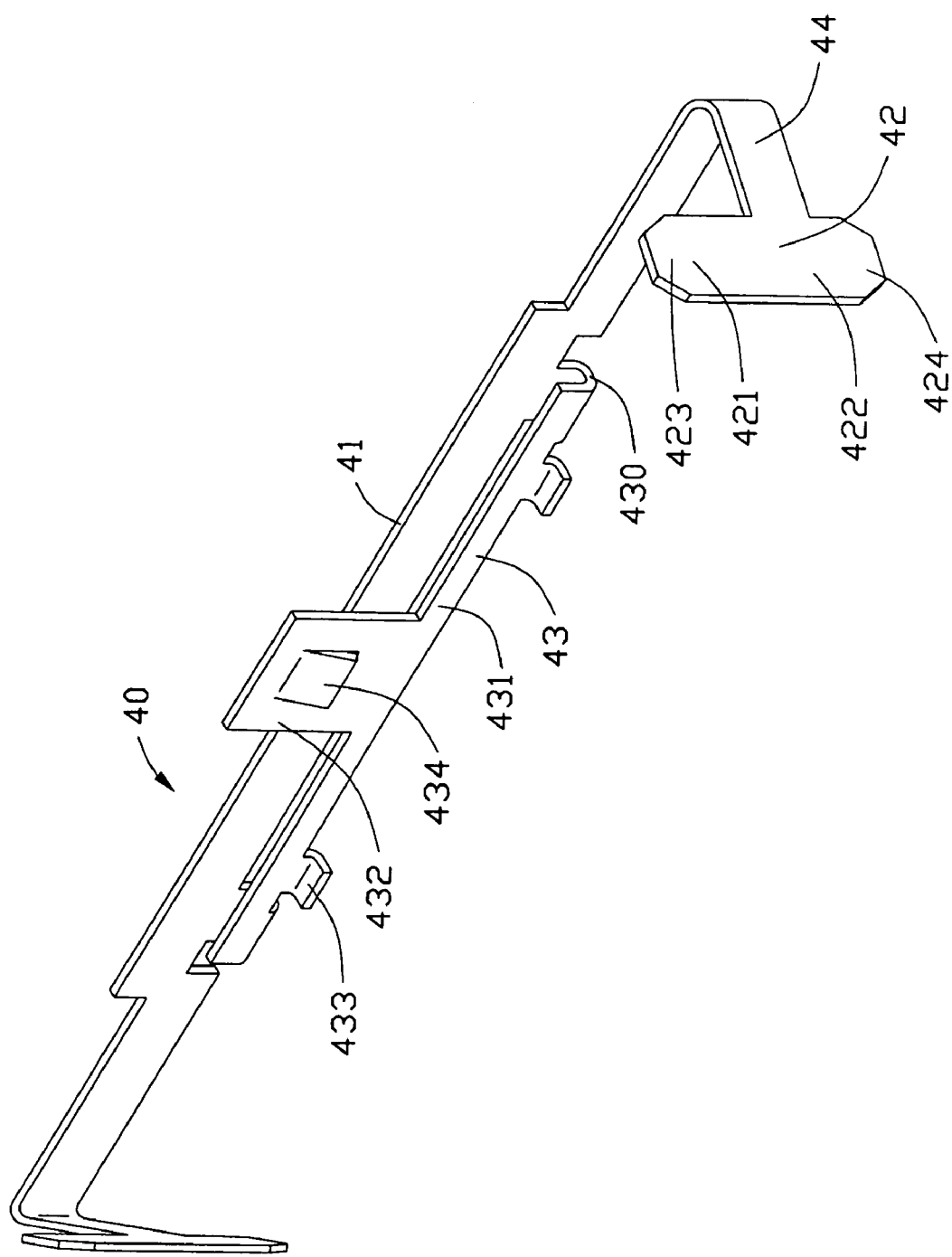
FIG. 2 is an enlarged perspective view of a board hold down of the electrical connector assembly of FIG. 1.

Referring to FIG. 2, the board hold down 40 is stamped and formed from a sheet of metal and comprises an elongate body portion 41, a pair of supporting portions 44 forwardly and inwardly bent from opposite ends of the body portion 41, a pair of retaining portions 42, and an operating portion 43. The retaining portions 42 are vertical enlarged pieces upwardly and downwardly extending from free ends of the pair of supporting portions 44. An upper half of each of the retaining portions 42 functions as a positioning portion 421 and a lower half of each of the retaining portions 42 functions as a mounting portion 422. The positioning portion 421 and the mounting portion 422 are respectively formed with lead-ins 423, 424 at distal ends thereof. The supporting portions 44 are delectable for aligning the mounting portions 422 with the retention holes 13 of the mother board 10. The operating portion 43 includes a pair of U-shaped connect portions 430 at opposite ends thereof and connecting with a lower edge of the body portion 41, a beam portion 431 extending between the pair of connect portions 430 and substantially parallel to the body portion 41, and a latch portion 432 extending upwardly from a middle portion of the beam portion 431. A pair of lever portions 433 project forwardly from the beam portion 431 adjacent to opposite ends thereof. The latch portion 432 includes a spring tab 434 stamped therefrom.

Figure 3:
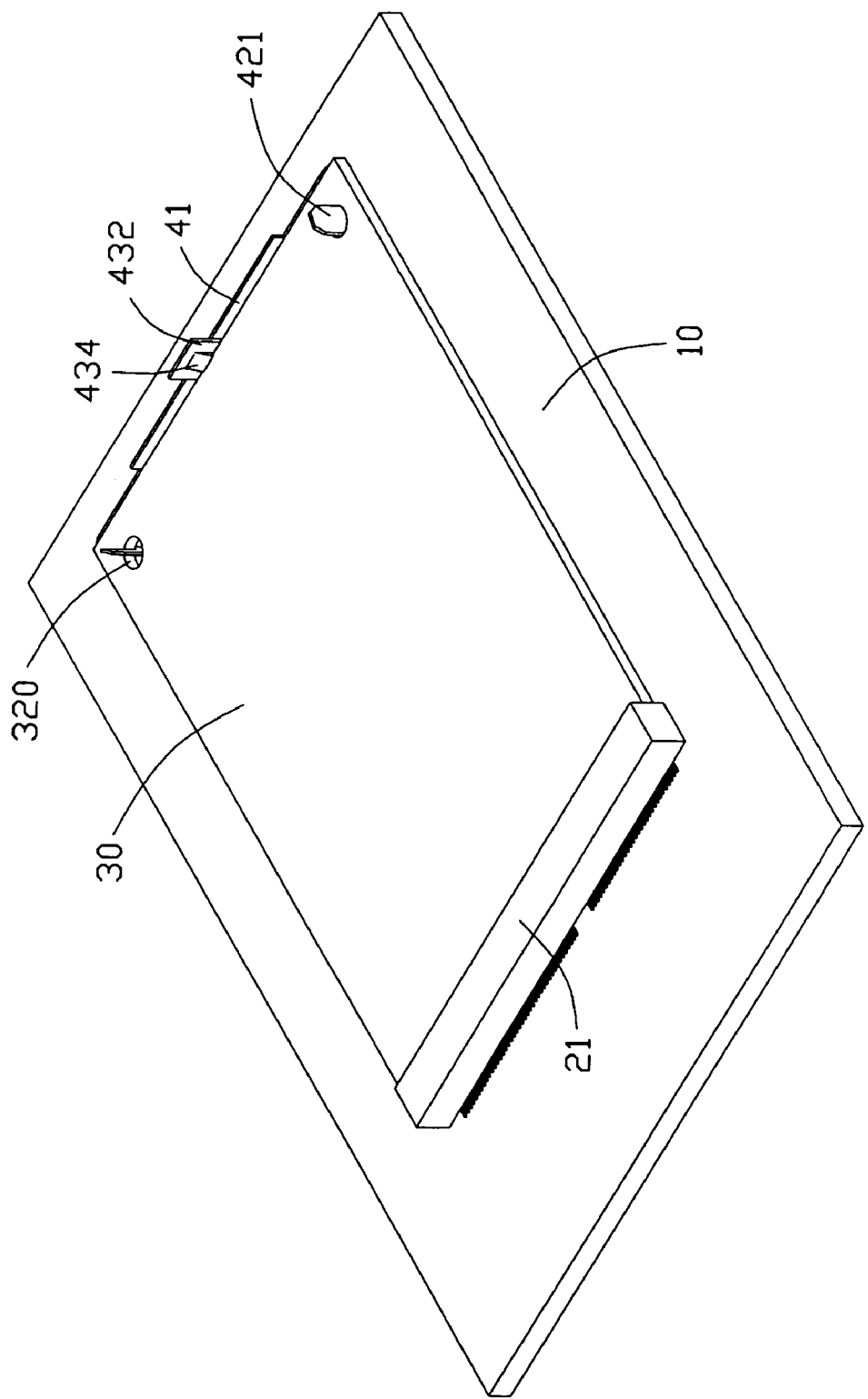
FIG. 3 is an assembled perspective view of the electrical connector assembly of FIG. 1.
Figure 4:
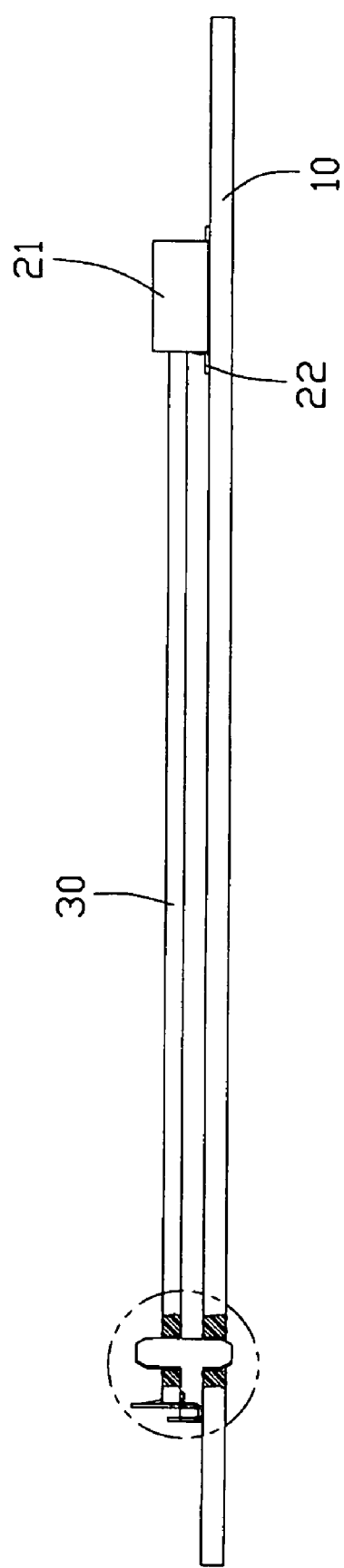
FIG. 4 is a side elevational and partially cross-sectional view of the electrical connector assembly of FIG. 3.
Figure 5:
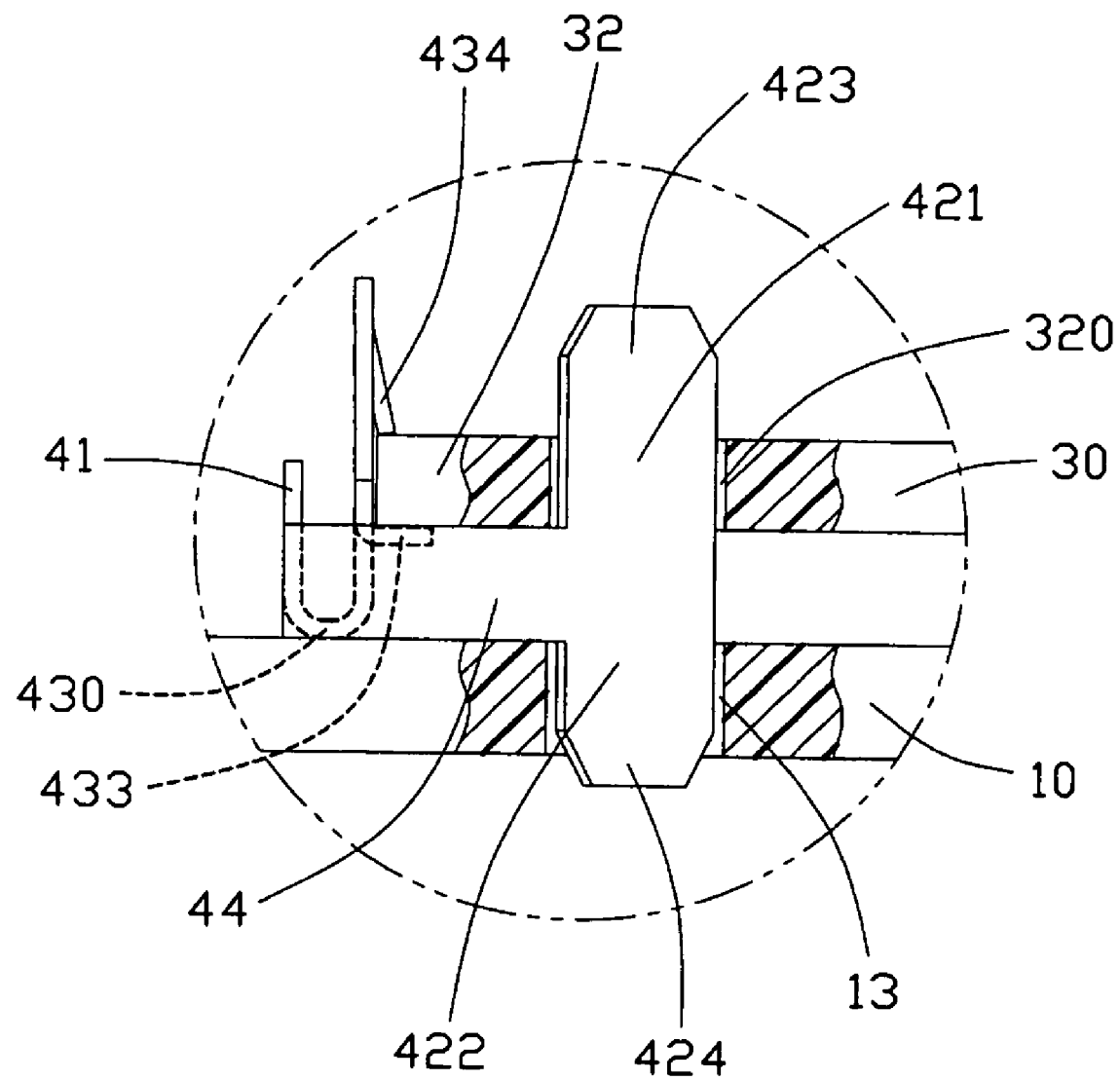
FIG. 5 is an enlarged view taken from a circle of FIG. 4.

Referring to FIGS. 3–5, in assembly, the card edge connector 20 is mounted on the upper surface 12 of the mother board 10 with tail portions (not labeled) of the contacts 22 being soldered to the solder pads 11 of the mother board 10. The mounting portions 422 of the board hold down 40 are inserted into the retention holes 13 of the mother board 10 by the leading of the lead-ins 424 and soldered in the retention holes 13 for retaining the board hold down 40 to the mother board 10. The mating edge 31 of the daughter card 30 is inclinedly inserted into a corresponding slot (not shown) of the housing 21 to establish an electrical connection between the conductive pads 33 of the daughter card 30 and the contacts 22 of the card edge connector 20. The rear edge 32 of the daughter card 30 is then pivoted downwardly. The spring tab 434 of the latch portion 432 of the board hold down 40 is rearwardly pressed by the rear edge 32. When the rear edge 32 of the daughter card 30 is pivoted to its final position, the spring tab 434 resumes to its original state and tightly abuts against an upper face the rear edge 32 of the daughter card 30 to prevent the rear edge 32 from upwardly moving. Simultaneously, the positioning portions 421 of the board hold down 40 engage with the engaging holes 320 of the daughter card 30 by the guiding of the lead-ins 423 to accurately position the daughter card 30, thereby achieving a correct engagement between the daughter card 30 and the card edge connector 20. The supporting portions 44 of the board hold down 40 support a lower face of the rear edge 32 of the daughter card 30 to keep the daughter card 30 parallel to the mother board 10 and to space a predetermined distance from the mother board 10. When the latch portion 432 is pushed rearwardly to withdraw the spring tab 434 from the upper face of the rear edge 32 of the daughter card 30, the rear edge 32 rises up automatically with the action of the lever portions 433 of the board hold down 40, whereby the daughter card 30 is easily removed from the card edge connector 20. The body portion 41 can prevent the latch portion 432 from being over-pushed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly, comprising:
  a mother board defining a pair of retention holes;
  a card edge connector mounted on the mother board;
  a daughter card comprising a mating edge inserted into the card edge connector, and a rear edge opposite to the mating edge and defining a pair of engaging holes; and
  a board hold down comprising a pair of retaining portions and an operating portion between the pair of retaining portions, each of the retaining portions including a mounting portion soldered in a corresponding retention hole of the mother board and a positioning portion engaged with a corresponding engaging hole of the daughter card, the operating portion including a latch portion having a spring tab abutting against an upper face of the rear edge of the daughter card.

2. The electrical connector assembly as claimed in claim 1, wherein the daughter card is parallel to the mother board and is spaced a predetermined distance from the mother board.

3. The electrical connector assembly as claimed in claim 1, wherein the engaging holes of the daughter card are vertical aligned with the retention holes of the mother board.

4. The electrical connector assembly as claimed in claim 1, wherein the operating portion of the board hold down comprises a pair of lever portions under the lower face of the rear edge of the daughter card.

5. The electrical connector assembly as claimed in claim 1, wherein the mounting portions and the positioning portions of the board hold down are respectively formed with lead-ins at distal ends thereof.

6. The electrical connector assembly as claimed in claim 1, wherein the board hold down comprises a body portion, a pair of deflectable supporting portions bent from opposite ends of the body portion and supporting the rear edge of the daughter card, and wherein the pair of retaining portions are formed at free ends of the pair of supporting portions.

7. The electrical connector assembly as claimed in claim 6, wherein the operating portion of the board hold down comprises a pair of connect portions connecting with the body portion.

8. The electrical connector assembly as claimed in claim 7, wherein the operating portion of the board hold down comprises a beam portion which is substantially parallel to the body portion of the board hold down.

9. An electrical connector assembly, comprising:
  a printed circuit board;
  a card edge connector located on a first position of said printed circuit board;
  a board hold-down secured on second position of the printed circuit board far from said connector in a lengthwise direction, said board hold-down defining thereof a pair of immovable upwardly extending securing tags on two sides and a moveable operation portion between said securing tags in a lateral direction perpendicular to said lengthwise direction; and
  a daughter board located between said connector and said board hold-down and having thereof a first end received in the connector and a second end, opposite to said first end in said lengthwise direction, retained downwardly by a latching portion of said operation portion.

10. The assembly as claimed in claim 9, wherein said pair of securing tags engage the daughter board to prevent said daughter board from moving in a horizontal plane defined by said lengthwise direction and said lateral direction.

11. The assembly as claimed in claim 9, wherein said operation portion is movable in the lengthwise direction.

12. The assembly as claimed in claim 9, wherein said bottom ends of said pair of securing tags extend into corresponding holes in said printed circuit board.

13. The assembly as claimed in claim 9, wherein said operation portion imposes a force upon the second end of the daughter board to urge said daughter board toward said connector in said lengthwise direction.

14. The assembly as claimed in claim 9, wherein said board hold-down further includes a supporting portion to upwardly support the second end of the daughter board in vertical direction perpendicular to both said lengthwise direction and said lateral direction.

15. The assembly as claimed in claim 14, wherein said supporting portion is formed on said operation portion.

16. The assembly as claimed in claim 15, wherein said daughter board defines a pair of through holes through which said pair of securing tags.

17. The assembly as claimed in claim 9, wherein said board hold-down includes a body portion extending in said lateral direction to connect said pair of securing tags.

18. The assembly as claimed in claim 17, wherein said operation portion is linked to a side edge of said body portion via a join portion.

19. An electrical connector assembly comprising:
    a printed circuit board;
    a card edge connector located on a first position of said printed circuit board;
    a board hold-down secured on second position of the printed circuit board far from said connector in a lengthwise direction, said board hold-down comprising a pair of supporting portions at distal ends thereof and a moveable operation portion between the pair of supporting portions; and
    a daughter board located between said connector and said board hold-down, and having thereof a first end received in the connector and a second end, opposite to said first end in said lengthwise direction, retained downwardly by a latching portion of said moveable operation portion and upwardly supported by said supporting portions in a vertical direction perpendicular to said lengthwise direction.

20. The assembly as claimed in claim 19, wherein said operation portion imposes a force against the second end of the daughter board to urge said daughter board toward said connector in said lengthwise direction.

\* \* \* \* \*